United States Patent [19]

Hagiwara et al.

[11] Patent Number: 5,292,618

[45] Date of Patent: Mar. 8, 1994

[54] PHOTOCURABLE SELF-RETAINABLE GEL, SHAPED ARTICLE PREPARED THEREFROM, APPLICATIONS AND PREPARATIONS THEREOF

[75] Inventors: Yoshichi Hagiwara; Yuichi Mori; Hiroshi Samukusa, all of Kanagawa; Kazuhide Saigo, Tokyo, all of Japan

[73] Assignee: W. R. Grace & Co.-Conn., New York, N.Y.

[21] Appl. No.: 687,358

[22] Filed: Apr. 18, 1991

[30] Foreign Application Priority Data

| Apr. 19, 1990 | [JP] | Japan | 2-104357 |
| Apr. 19, 1990 | [JP] | Japan | 2-104358 |
| Feb. 28, 1991 | [JP] | Japan | 3-034267 |
| Mar. 1, 1991 | [JP] | Japan | 3-036077 |

[51] Int. Cl.$^5$ .............................. G03C 1/725
[52] U.S. Cl. ............................ 430/280; 430/281; 430/910; 522/109; 522/121
[58] Field of Search ............ 430/281, 910, 280; 522/109, 121

[56] References Cited

U.S. PATENT DOCUMENTS 4,125,700  11/1978  Graham ......................... 430/281 X

FOREIGN PATENT DOCUMENTS

| 47-14834 | 5/1972 | Japan . |
| 48-55946 | 8/1973 | Japan . |
| 50-128773 | 10/1975 | Japan . |
| 53-40615 | 10/1978 | Japan . |
| 55-218692 | 2/1980 | Japan . |
| 55-28054 | 7/1980 | Japan . |
| 62-138845 | 6/1987 | Japan . |
| 62-254142 | 11/1987 | Japan . |
| 63-8648 | 1/1988 | Japan . |
| 1-131548 | 5/1989 | Japan . |

OTHER PUBLICATIONS

Journal of Applied Polymer Science, vol. 20, 1775-1785 (1976) "Viscoelastic Properties of Stereocomplex Polymers"; Y. Mori et al.
Journal of Polymer Science, vol. XVI, pp. 345-355 (1955): "Preparation of Graft Copolymers from Autoxidized Polystyrene Derivatives"; D. J. Metz et al.
Kagakudojin, pp. 225 to 226 and pp. 386 to 387 (1972): "Experimental Methods for Polymer Syntheses"; T. Ohtsu et al.
Catalog by Toa Gosei Kagaku Kabushiki Kaisha—Macromonomers.
Catalog by Toa Gosei Kagaku Kabushiki Kaisha—Reseda.
Chemical Abstracts, vol. 82, No. 16, 1975, Columbus, Ohio, USA, Toray: "Hydrophilic Polymer Gels for Prosthetic Materials", Abstract No. 99107t of Japan Kokai 74-98,856.

Primary Examiner—Marion E. McCamish
Assistant Examiner—Mark A. Chapman
Attorney, Agent, or Firm—Valerie E. Looper

[57] ABSTRACT

A photocurable gel suitable for articles such as printing plates, photoresists and the like is disclosed. The photocurable gel comprises (a) a polymer composition having isotactic polymethyl methacrylate moiety; and syndiotactic polymethyl methacrylate moiety; (b) a photopolymerizable ethylenically unsaturated compound; and (c) a photopolymerization initiator. The gel is solid at ambient temperature and is capable of undergoing reversible gel/sol transition by heating or cooling. Methods of preparing articles, as well as methods of fixing articles, which use the gel are also disclosed. Such methods include sealing or affixing component parts on an electronic circuit board.

16 Claims, 3 Drawing Sheets

PHOTOCURABLE SELF-RETAINABLE GEL, SHAPED ARTICLE PREPARED THEREFROM, APPLICATIONS AND PREPARATIONS THEREOF

TECHNICAL FIELD

The present invention relates to photocurable, self-retainable gels, articles prepared from such gels, and methods for fixing an article by using such gels. A "self-retainable" gel is defined as that which is solid under ambient conditions and is capable of undergoing reversible gel/sol transition by heating or cooling.

BACKGROUND ART

Because of their properties, photocurable resin compositions are widely used for many purposes. For instance, photocurable resin compositions are stable at ambient temperature if they are not exposed to light. In addition, cured articles can be prepared therefrom in a short period of time by exposure to light without using heat. Accordingly, photocurable resin compositions, both solid and liquid, are widely used in paint, ink, coatings, insulation, relief printing plates and resist materials for the preparation of printed circuit boards.

The preparation of a liquid photocurable resin composition is relatively easy. However, when it is used as photoresist for the preparation of printed circuit boards, for example, the resist-coated boards cannot be easily stacked and stored because of the resulting liquid, tacky resist coating on the boards. For the same reason, a photo-imaging mask cannot be directly placed in contact with the resin composition. Further, when a liquid resist is used as potting material for electronic parts or components, specific amounts of the liquid photocurable resin composition have to be weighed and applied to an electronic part or component in a mold prior to irradiating and curing the composition with light. Such steps are laborious and uneconomical.

In addition, if the mold used is non-transparent metal, only the area of resist directly under or adjacent to the mold's aperture can be cured. Thus, the size and shape of the electronic part or component which can be used will be limited.

To avoid problems associated with liquid photocurable compositions, solid compositions are sometimes used. Prior to forming those solid compositions, the photocurable resin is dissolved in solvent which is removed prior to photocuring For example, when using solid compositions as a photoresist for the production of printed circuit boards, the solution of resist is directly coated onto a copper clad laminate and then dried by removing solvent. In the alternative, it may be coated and dried on a temporary substrate such as a polyester film to form a film-like resist, which is then transferred to the copper clad laminate. However, removal of the solvent not only takes more time than methods using liquid resists, but also the evaporation of solvent during the removal causes environmental problems. Even further, defects caused by air bubbles appear in the resist during the drying and transferring steps. Furthermore, when a relatively thick and uniform sheet material such as a photosensitive sheet for letterpress printing is required, it is fairly difficult to economically remove the solvent and dry the sheet without formation of bubbles. It is also difficult to obtain a sheet having a uniform thickness due to shrinkage, surface tension, and hot air which is typically used in the drying process. As a result of these difficulties special and expensive apparatus are required. Moreover, a photocurable resin composition which contains a solvent is generally not suitable for potting electronic parts or components which usually have a complicated shape.

To avoid these flaws and problems, especially in the area of solid photocurable sheets for letterpress printing, efforts have been made to prepare a photocurable resin composition which can be melted and cast without using any solvent. See Japanese Patent Publication (Kokai) Nos. SHO 62-138845 (1987), SHO 63-8648 (1988) and HEI 1-131548 (1989). However, such photocurable compositions are inherently and eventually thermally curable. As a result, innovative resin formulations and apparatus are necessary in order to melt and cast such compositions continuously and steadily at elevated temperatures. Further, even if one can obtain a composition which is solid at ambient temperature and which possesses sufficient photosensitivity at ambient temperature, as well as sufficient stability in viscosity at high temperatures to allow melting and casting, a relatively longer period of time is still needed to solidify the melted composition after it leaves a nozzle at ambient temperature. As a result, special techniques would be required to obtain a sheet having the desired thickness.

Another problem occurs when potting electronic parts or components with these resin compositions. Because of the compositions' viscosities, they do not defoam easily. Thus, longer periods of time will be required to allow the compositions to solidify prior to being released from the mold.

Recently, in the area of photoimageable resists used in the manufacture of printed circuit boards or photocurable sheets for letterpress printing, efforts have focused on eliminating conventional organic solvents used to develop such resists. The aforementioned environmental reasons is a chief reason for such efforts. As a result, photocurable resin compositions developable with water or an aqueous alkaline solution have been developed and have been put to practical use. However, to obtain such water developable compositions other properties and advantages are compromised. For example, while it is desirable to have solder resists and letterpress printing plates which are aqueous developable, a high level of water resistance is still required for the images obtained after their development. In order to fulfil the latter requirement, liquid photocurable resin compositions are usually used because they are generally developable in water. However, as mentioned earlier, controlling the thickness of a coating prepared from such liquid photocurable resin compositions is difficult during a coating process. As mentioned earlier, obtaining precise images from such liquid coated articles is difficult because a photo mask cannot directly be placed in contact with the surface of liquid resin during exposure to light.

On the other hand, improvements have been made to solid photocurable resin compositions which can fulfil both of the requirements mentioned above. However, the manufacturing process, development process and post-treatment process used with those solid photocurable resin compositions are more complicated and time-consuming. Even further, treatment of the aqueous waste produced thereby still remains as a problem to be solved. Accordingly, the art in the technical areas mentioned above all still searching for a solventless photocurable composition which avoids the problems detailed above.

It is known that a mixture of an isotactic methyl methacrylate polymer and a syndiotactic methyl methacrylate polymer which can form a polymer complex. Several industrial applications of such polymer complexes have been proposed. For example, radiation degradable polymer mixtures of an isotactic member and a syndiotactic member for photoimaging are disclosed in Japanese Patent Publication Nos. (Kokoku) SHO 53-40615 (1978) and SHO 55-28054 (1980) and Japanese Patent Publication (Kokai) No. SHO 62-254142 (1977).

Further, gelled substances formed from a polymer complex of an isotactic polymethyl methacrylate and a syndiotactic polymethyl methacrylate in a solvent are proposed for use in organic electrolyte batteries [Japanese Patent Publication (Kokai) No. SHO 55-21862 (1980)]; for anti-blood coagulants [Japanese Patent Publication (Kokai) SHO 48-55946 (1973)]; and for semipermeable membranes or separatory membranes [Japanese Patent Publication (Kokai) No. SHO 50-128773 (1975)]. Compositions comprising a polymer complex of isotactic polymethyl methacrylate and syndiotactic polymethyl methacrylate in a solvent, wherein the composition reversibly and quickly undergoes gel/sol transition around the gel melting point are also known. Journal of Applied Polymer Science, Volume 20, pp. 1775-1785 (1976). A glass laminate prepared by dissolving an isotactic polymethyl methacrylate and a syndiotactic polymethyl methacrylate in polymerizable monofunctional monomers, pouring the solution in the space between two glass plates and polymerizing the monomers is also known. See Japanese Patent Publication (Kokuku) No. SHO 47-14834 (1972).

It has now been found that a variety of photopolymerizable ethylenically unsaturated compounds can dissolve polymer compositions having an isotactic polymethyl methacrylate moiety and a syndiotactic polymethyl methacrylate moiety, wherein these polymer compositions give a photocurable self-retainable gel capable of quickly and reversibly undergoing gel/sol transition by heating at a temperature above its flow temperature or cooling to a temperature below its flow temperature. In addition, the gel can easily be formed into a photocurable self-retainable shaped article, especially shaped articles, free of air bubbles in the absence of any additional solvent.

OBJECTS

It is an object of the invention to provide a photocurable self-retainable gel as a photocurable resin which avoids the above-described problems in the art.

It is another object of the invention to provide a method for preparing articles from the photocurable self-retainable gel.

Still another object of the invention is to provide a method for processing an article by using a photocurable self-retainable gel.

SUMMARY OF THE INVENTION

The above object of avoiding the problems in the art can be obtained from a photocurable self-retainable gel comprising (a) a polymer composition having an isotactic polymethyl methacrylate moiety and a syndiotactic polymethyl methacrylate moiety, (b) a photopolymerizable ethylenically unsaturated compound and (c) a photopolymerization initiator, said gel being solid at ambient temperature and capable of undergoing reversible gel/sol transition by heating or cooling.

The same objects can be obtained from the same photocurable self-retainable gel which further comprises (d) an epoxy compound having at least two epoxy groups and (e) an epoxy hardener.

The present invention also includes photocurable self-retainable articles prepared from such photocurable self-retainable gels.

In another aspect, the present invention comprises a novel method for preparing an article, wherein the method comprises the steps of:

exposing a photocurable self-retainable gel to actinic light through an image-bearing transparency whereby portions of said gel are cured, said gel comprising
  (a) a polymer composition having isotactic polymethyl methacrylate moiety and syndiotactic polymethyl methacrylate moiety,
  (b) a photopolymerizable ethylenically unsaturated compound; and
  (c) a photopolymerization initiator, said gel being solid at ambient temperature and capable of undergoing reversible gel/sol transition by heating or cooling; said gel being solid at ambient undergoing reversible gel/sol transition by heating or cooling,
(ii) melting uncured portions of said gel at a temperature above the flow temperature of said gel, and
(iii) removing the melted uncured portions In still another aspect, the present invention also comprises the same method wherein said gel in (i) further comprises (d) an epoxy compound having at least two epoxy groups and (e) an epoxy hardener and the method further comprises (iv) subjecting the article to heat.

In an even further aspect, the present invention comprises a method for processing an article. By "processing", such methods include, but are not necessarily limited to, attaching, adhering, sealing, protecting and encapsulating. Specifically, such methods comprise:
(i) melting a photocurable self-retainable gel at a temperature above the flow temperature of said gel to form a sol, wherein said gel is provided on said article and said gel comprising:
  (a) a polymer composition having isotactic polymethyl methacrylate moiety and syndiotactic polymethyl methacrylate moiety,
  (b) a photopolymerizable ethylenically unsaturated compound; and
  (c) a photopolymerization initiator, said gel being solid at ambient temperature and capable of undergoing reversible gel/sol transition by heating or cooling;
(ii) cooling said sol to a temperature below the flow temperature of said gel to convert said sol to a gel; and
(iii) exposing said gel to an actinic light.

In an even further aspect, the present invention comprises a method for processing an article, wherein the method comprises:
(i) exposing a portion of a photocurable self-retainable gel to actinic light, said gel comprising:
  (a) a polymer composition having isotactic polymethyl moiety and syndiotactic polymethyl methacrylate moiety;
  (b) a photopolymerizable ethylenically unsaturated compound; and
  (c) a photopolymerization initiator; said gel being solid at ambient temperature and capable of undergoing reversible gel/sol transition by heating or cooling, and said exposed portion having a larger surface area than the surface area of said article, (ii) melting the uncured portion of said gel at a temperature above the flow temperature of said gel,
(iii) placing said article in the melted, uncured portion of said gel,
(iv) exposing said melted, uncured portion to actinic light to process the article with the cured gel.

Both of the last two methods can employ gels which further comprise epoxy compounds having at least two epoxy groups and an epoxy hardener and wherein the method further comprises subjecting that gel to heat.

BRIEF DESCRIPTION OF THE DRAWINGS

FIG. 2-($a$) is a schematic plan of a substrate mounted with electronic parts or components to be protected or encapsulated with the photocurable self-retainable gel in accordance with the present invention.

FIG. 2-($b$) is a schematic cross section of the electronic parts or components and substrate as shown in FIG. 2-($a$).

FIG. 2-($c$) is a plan of a mask which can be electronic parts or components as shown in FIGS. 2-($a$) and 2-($b$) with the photocurable self-retainable gel in accordance with the present invention.

FIG. 2-($d$) is a schematic plan of the partially cured gel according to the invention after exposure to actinic light through the mask as shown in FIG. 2-($c$).

FIGS. 2-($e$)-1, 2-($e$)-2 and 2-($e$)-3 are schematic cross sections of the partially cured gel as shown in FIGS. 2-($d$), respectively.

FIG. 2-($f$) is a schematic cross section of the electronic parts or components on the substrate as shown in FIGS. 2-($a$) and 2-($b$) protected or encapsulated with the melted uncured gel according to the present invention.

FIG. 2-($g$) is a schematic cross section of the substrate mounted with the electronic parts or components as shown in FIGS. 2-($a$) and ($b$) which are protected or encapsulated with the cured gel according to the present invention.

DETAILED DESCRIPTION OF THE INVENTION

In the present invention any commercially available isotactic polymethyl methacrylate and syndiotactic polymethyl methacrylate can be employed in the polymer composition having isotactic polymethyl methacrylate moiety and syndiotactic polymethyl methacrylate moiety. The polymer composition can be obtained by mixing a polymer having an isotactic polymethyl methacrylate moiety with a polymer having a syndiotactic polymethyl methacrylate moiety. The polymer composition can also comprise a polymer having both isotactic and syndiotactic polymethyl methacrylate moieties.

The ratio of the isotactic polymethyl methacrylate moiety and the syndiotactic polymethyl methacrylate moiety in the polymer composition can be calculated from NMR spectra and is typically in the range of from 0.1 to 10. This value is expressed as a triad value. It is also suitable if the total amount of the isotactic and syndiotactic polymethyl methacrylate moieties is greater than the amount of heterotactic polymethyl methacrylate moiety.

Polymer compositions having the above described ratio can easily be prepared by mixing a polymethyl methacrylate polymer having a relatively high isotacticity with a polymethyl methacrylate having a relatively high syndiotacticity. Conventional methods of mixing can be used to obtain such mixtures.

In certain instances, it may be preferable that the polymer compositions comprise certain copolymers of methyl methacrylate. For instance, when photocurable self-retainable gels and photocurable self-retainable articles of the present invention are stored at ambient temperatures for a long period of time monomer bleeding may occur. Such bleeding may cause difficulties when placing an image-bearing transparency for photoimaging on the surface of the gel or a shaped article. It has been found that copolymers of methyl methacrylate and a monomic compound copolymerizable therewith, e.g. vinyl monomer, can reduce monomer bleeding from gels and articles. Any type of methyl methacrylate copolymer, such as random, graft and block, can be used for the prevention of monomer bleeding, provided the copolymer can form an uncured gelled article. Moreover, monomers copolymerizable with methyl methacrylate should be selected so that the copolymers resulting therefrom satisfy the above described ratio of isotactic polymethyl methacrylate moiety to syndiotactic polymethyl methacrylate moiety. For example, if random copolymers are used, and the ratio of the comonomers to methyl methacrylate is high, the resulting copolymers fail to form a gel. Accordingly, the amount of the above described comonomers in the copolymer should be below 10% by mol, preferably below 5% by mol of the polymer.

Various methods well-known in the art can be used to prepare copolymers of the above-described monomers and methyl methacrylate. For instance, if styrene is used to prepare the copolymer, a graft copolymer can be obtained by alkylating a polystyrene and then grafting the resulting alkylated polymer with methyl methacrylate after introducing a hydroperoxide group through use of a peroxide. See *Journal of Polymer Science*, Vol. 16, p. 345 (1955). If a methyl methacrylate is polymerized after carrying out a living polymerization reaction of styrene, a block polymer containing blocks of methyl methacrylate can be obtained. See T. Ohtsu and M. Kinoshita, *Kōbunshi Gōsei No Jikkeu*, "Experiments for Polymer Synthesis," p. 225, 1972, Kagakudojin.

Besides the above-described methods, a "macromonomer" process can also be used. See pamphlets of Toagosei Chemical Industries Co. titled "Macromonomer/reactive polymers" and "RESEDA/macromer process: Comb-type graft polymer". Use of the "macromonomer" process readily yields block copolymers or graft copolymers containing a variety block methyl methacrylate polymer sequences. A variety of "macromonomers" are known, some of which are commercially available. Among the "macromonomers" having methyl methacrylate polymer chains, "macromonomer" grades AA-6, HA-6, and CA-6 products of Toagosei Industries Co. are available. AA-6 macromonomer, like methyl methacrylate monomer, copolymerizes with a variety of the monomer species described below to give a variety of copolymers having polymethacrylate block. Examples of such copolymers which are commercially available include RESEDA GP-100, GP-200, and GP-300 products of Toagosei Chemical Industries Co. HA-6 and CA-6 products can be condensed with diols or dicarboxylic acids to give polyesters having polymethacrylate block, or they react with isocyanates to give polyurethane or polyamides that contain polymethacrylate blocks. Furthermore, HA-6 and CA-6 can be reacted with polymers that have functional groups capable of reacting with acyl anhydride, hydroxyl group such as glycidyl group, or carboxyl group, to introduce a polymethacrylate block into the polymer.

Suitable examples of monomers which are suitable for preparing copolymers with methyl methacrylate include styrene, acrylonitrile, methacrylonitrile, methyl acrylate, ethyl acrylate, n-butyl acrylate, ethyl methacrylate, isobutyl methacrylate, cyclohexyl methacrylate, acrylamide, methacrylamide, N,N-dimethyl methacrylamide, 2-hydroxyethylacrylate, 2-hydroxyethyl methacrylate, 2-hydroxypropyl methacrylate, glycerin monomethacrylate, polyethyleneglycol methacrylate, methylvinyl ketone, methylisopropenyl ketone, N-vinylpyrrolidone, diacetone acrylamide, maleic anhydride, dimethyl itaconate, allyl acetate, acrylic acid, methacrylic acid, alpha-chloroacrylic acid, alpha-ethylacrylic acid, alpha-cyanoacrylic acid, allyl carboxylic acid, crononic acid, itaconic acid, maleic acid and their sodium salts, potassium salts, ammonium salts, diethylamine salts, pyrridine salts, tetramethylammonium salts, vinylsulfonic acid, allylsulfonic acid, methacrylsulfonic acid, p-styrenesulfonic acid, 3-methacryloxypropane sulfonic acid, 3-acryloxypropane sulfonic acid, 2-acrylamide-2-methylpropanesulfonic acid, 2-acrylamide-2-methylpropanesulfonic acid and their sodium salts, potassium salts, ammonium salts, pyridine salts, quinoline salts and tetremethylammonium salts. In addition, it is possible to use polyfunctional vinyl monomers such as ethyleneglycol dimethacrylate, methylenebisacrylamide and triallyl cyanurate in combination with the above described monomers. It is also preferable that the monomers selected result in copolymers which are soluble in the photopolymerizable ethylenically unsaturated compounds described below.

The photopolymerizable ethylenically unsaturated compounds which are employed in the present invention may be any compound having at least one ethylenic double bond and capable of dissolving the polymer composition having isotactic polymethyl methacrylate moiety and syndiotactic polymethyl methacrylate moiety.

Suitable examples of such compounds include various kinds of monoacrylates and monomethacrylates, reaction products of unsaturated carboxylic acids such as acrylic acid or methacrylic acid and an alkylene glycol; monovalent or polyvalent acrylates and methacrylate synthesized from unsaturated epoxy compounds and carboxylic acids, unsaturated carboxylic acids and amines; monovalent or polyvalent (meth)acryl amides; monovalent or polyvalent (meth)acrylates from urethane oligomers or ester oligomers; liquid polybutadienes and polyisoprenes known as liquid rubbers; polyene oligomers and modified products of such liquid rubbers. These compounds can be used alone or as a mixture.

Further, it is preferred that the photopolymerizable ethylenically unsaturated compounds have a boiling point of higher than 100° C. When the boiling point is lower than 100° C., offensive odor or bubbles occur during the preparation of articles from the photocurable self-retainable gel according to the present invention.

The amount of the photopolymerizable ethylenically unsaturated compounds is typically 97 to 10% by weight and preferably 95 to 50% by weight based on the total weight of the photocurable self-retainable gel.

The photopolymerization initiator which is employed in the present invention may be any conventional photopolymerization initiator. Such initiators include, as preferred examples, benzophenones, benzylalkyls ketals, anthraquinones and thioxantones. Although there is no particular restriction about the amount of the photopolymerization initiator to be used in the gel of the present invention, the amount is preferably 0.01–10% by weight based on the total weight of the gel. When the amount is higher than 10% by weight, transmission of actinic light through the gel is hindered due to absorption of light by the photopolymerization initiator. On the other hand, amounts of less than 0.01% by weight do not give sufficient photocuring.

The photocurable self-retainable gel of the present invention may also contain polymerization inhibitor. Preferred examples of conventional polymerization inhibitors include phenols, hydroquinone and catechol. The amount of polymerization inhibitor which can be employed is typically 0.001 to 5% by weight based on the total weight of the gel.

In order to improve the adhesiveness and the heat resistance of cured articles obtained from the photocurable self-retainable gel of the present invention, epoxy compounds having at least two epoxy groups can be added to the photocurable self-retainable gel. Such epoxy compounds are preferably selected not only on the basis of their ability to dissolve the polymer composition having the isotactic and syndiotactic polymethyl methacrylate moieties, but also depends on the adhesiveness and heat resistance desired for the photocurable self-retainable article and the cured shaped articles obtained therefrom.

Examples of suitable epoxy compounds include glycidyl ether type epoxy resins such as bisphenol A type epoxy resins, glycidyl esters of polyvalent carboxylic acids, glycidyl amine type epoxy resins, linear aliphatic epoxy resins, alicyclic epoxy resins and Novolak type epoxy resins. These epoxy compounds can be used alone or in a mixture. Epoxy compounds having only one epoxy group can also be used together with these epoxy compounds.

When the photocurable self-retainable gel of the present invention contains the epoxy compound, it is also necessary to use an epoxy hardener or an epoxy curing catalyst. In the present invention any conventional epoxy hardener or epoxy curing catalyst can be employed. Latent epoxy hardeners or catalysts are preferred in order to prevent premature crosslinking during the preparation of photocurable sols containing epoxy compounds.

Examples of suitable latent epoxy hardeners which can be employed in the present invention are trifluoroborate-amine salts, imidazole derivatives, dicyandiamide and its derivatives, organic acid hydrazides, amine imides, dimethylureas and isocyanate treated polyamines. Commercially available latent curing agents include Novacure® curing agent from Asahi Kasei K.K. and Amicure® curing agent from Ajinomoto K.K. Other epoxy hardeners such as polycarboxylic acids, e.g. dicarboxylic acids, may also be used together with the above-described latent epoxy hardeners. In such instances these hardeners would be the primary hardener for the epoxy-containing composition and the latent epoxy hardeners would be the secondary hardener.

As indicated earlier, when the gel of this invention contains epoxy compounds the methods of this invention employ a heating step. Although the heating step differs depending on the types or amounts of epoxy used, the methods will typically employ temperatures in the range of 100–200° C. and preferably 120–180° C. Heating times of more than thirty minutes and preferably more than an hour are employed.

The total amount of epoxy compound and epoxy hardener or epoxy curing catalyst employed is typically 5 to 85% by weight and preferably 10 to 75% by weight based on the total weight of the photocurable self-retainable gel.

Incorporation of an "oil gelation agent" with the photocurable self-retainable gel of the present invention may also be desirable. It has been found that such agents effectively reduce or prevent monomer bleeding from the photocurable self-retainable gel and photocurable self-retainable articles of the present invention.

Suitable oil gelation agents include those agents which do not adversely affect photocuring of the photocurable self-retainable gel or shaped article. Preferred oil gelation agents include N-acyl amino acid amine salts, N-acyl amino acid amides, N-acyl amino acid esters, 12-hydroxy stearic acid, condensates of benzaldehyde and polyol and acrylated polysaccharides. Specific examples of N-acylamino acid-amine salts, N-acylamino acid esters, and N-acylamino acid amides have glycine, alanine, serine, phenylalanine, cysteine, methionine, aminocaproic acid, lysine, ornithine, arginine, glutamic acid, or asparatic acid in the amino acid moiety. Linear or branched, saturated or unsaturated aliphatic acyl group or aromatic acyl group having 1–30 carbons can serve as the N-acyl group. Particularly preferred groups are caproyl, capryloyl, lauroyl, myristoyl, stearoyl groups and the like. To prepare the N-acylamino acid esters, alcohols having 1–30 carbons can be used. Octyl alcohol, lauryl alcohol, cetyl alcohol, stearyl alcohol, isostearyl alcohol are preferred. The amine salts to be used for amidation and the amine salts include primary amines, secondary amines, monoalcohol amines and dialcohol amines having 1–60 carbons, and ammonia. For amine salts, tertiary amines and trialcohol amines can also be used. Any polyvalent alcohols having a valency of four or more can be used to prepare the condensation product of the polyvalent alcohol and benzaldehyde. Examples of polyvalent alcohols include sorbitol, xylitol, pentaerythritol, mannitol and the like. Dehydrocondensation products of polysaccharides, such as cellulose or dextrin, and $C_8-C_{18}$ aliphatic acids can be used as the acylated polysaccharides. 12-hydroxystearic acid can also be used.

The amount of the oil gelation agent which can be employed in the photocurable self-retainable gel of the present invention is typically 0.1 to 20% by weight. When the amount is less than 0.1% by weight, sufficient reduction of monomer bleeding cannot be expected. On the other hand, amounts of more than 20% by weight render the gel too brittle.

Other additives may be incorporated into the photopolymerizable self-retainable gel of the present invention. These additives include dyes, pigments, tackifying agents, organic and inorganic particles, electrically conductive particles, surfactants, antifoaming agents, UV absorbers, fragrance and plasticizers. Generally, the type of additive depends on the desired properties of the cured articles.

The photocurable self-retainable gel of the present invention can be prepared by dissolving the polymer composition having isotactic polymethyl methacrylate moiety and syndiotactic polymethyl methacrylate moiety in the photopolymerizable ethylenically unsaturated compound under heating, and preferably in the presence of the polymerization inhibitor. The temperature of the resulting solution or "sol" is then lowered, whereafter photopolymerization initiator is added to the solution and the mixture solution is cooled to or below ambient temperature to form a gel according to the invention. Afterwards, if desired or necessary, any epoxy compound and epoxy hardener can be added to the solution before cooling.

The flow temperature of the photocurable self-retainable gel is preferably lower than 150° C. and more preferably lower than 130° C. When the flow temperature of the gel is higher than 150° C., thermal polymerization of the photopolymerizable ethylenically unsaturated compounds may occur and unexpectedly bubbles may be formed from volatile substances, such as contaminated water, if the gel had to be processed at such temperatures.

As indicated earlier the gel according to this invention is capable of undergoing reversible gel/sol transition by heating or cooling. When the gel is heated to its flow temperature or above, the photocurable, self-retainable gel is converted into a sol. The melt viscosity of the sol should preferably be lower than 10,000 poises at 150° C. and more preferably lower than 10,000 poises at 130° C. However, the Viscosity may vary depending on the photopolymerizable ethylenically unsaturated compound, the epoxy compound and other additives employed, as well as depend on the particular applications of the sol. When the sol's viscosity is higher than 10,000 poises at 150° C., expensive equipment is necessary for dissolving, processing and molding the sol. Even further, contamination of the sol with air bubbles tends to occur when pouring sols having such viscosities.

It is also difficult to obtain the desired viscosity when the total amount of the polymer composition having isotactic polymethyl methacrylate moiety and syndiotactic polymethyl methacrylate moiety is higher than 70% by weight. Accordingly, the total amount of the polymer composition is preferably at most 70% by weight and more preferably less than 50% by weight based on the total weight of the photocurable self-retainable gel.

When the sol is converted to a gel by cooling the sol to a temperature below the flow temperature of the photocurable self-retainable gel, slow gelation times cause the following problems. For example, if the sol is formed into a sheet, slow gelation makes it difficult to give a sheet having the precise thickness desired. If the sol is used to prepare a transfer type adhesive by coating the sol onto a sheet of release paper, slow gelation makes it difficult to wind up the coated sheet of paper. Moreover, if the sol is used for protecting or encapsulating electronic parts or components in a mold, slow gelation would require more time in the mold prior to releasing the uncured gel. Even further, when the sol is applied as resist for the production of printed circuit boards, slow gelation after application requires a longer waiting period before placing a photo-imaging mask in contact with the gel. Thus, gelation times preferably should be less than 30 minutes While gelation time can be regulated by properly selecting and adding the ethylenically unsaturated compound, it will occasionally be difficult to obtain an article having form-retainability at room temperature, if the content of the methacrylate polymer composition is less than 3% by weight. In most instances, the content of the polymer component should be higher than 3% by weight and preferably higher than 5% by weight of the total composition.

The photocurable self-retainable gel and the photocurable self-retainable article obtained therefrom can be cured by actinic light having a wavelength in the range of 200 to 600 nm. Suitable light sources include carbon arcs, mercury vapor arcs, fluorescent lamps with phosphors emitting ultraviolet rays, argon and xenon glow lamps, tungsten lamps, and photographic flood lamps. Of these light sources, mercury vapor arcs, particularly sun lamps, fluorescent lamps, and metal halide lamps are preferred.

The photocurable self-retainable gel of the present invention has a variety of applications with or on numerous articles, thus resulting in a variety of methods by which the articles can be formed or processed. The shape of uncured articles comprising the gel of this invention and the methods of forming or processing such articles are based on the article's desired shape and its application.

In general, the methods of this invention include those by which the composition, in a state of molten sol, is cast onto a supporting member or placed in a mold and cooled to ambient temperature, e.g. about 10° C. to about 30° C., at atmospheric pressure, to form a gel, and thus forming an article. Other methods include those by which the composition is formed into a specific shape such as a sheet, which is then placed in a certain place, and then melted to fit the shape of that location. The sol is then cooled to ambient temperature to resolidify the material and to form the desired article.

Since the gel of this invention is capable of undergoing reversible gel/sol transformation, a very wide range of applications are possible. The ease of regulating the melt viscosity of the sol also allows for a variety of applications. For example, an article formed according to the invention can be obtained by heating, melting and removing a specific unrequired part of the formed article. Because the gel is solid at room temperature, it can be easily shipped or laminated. Use of a solid material is more convenient and can be more easily used in automated processes than liquid materials which require specific metering and distribution steps. The methods of this invention are possible only because the gelled composition of the invention has a sharp gel melting point and can be regulated in such a way to have a low melt viscosity.

Specific applications and articles are now described.

If the photocurable self-retainable gel of the present invention is employed as an adhesive, the gel is melted at a temperature above the flow temperature of the gel to give a sol, with the resulting sol formed into a film or sheet having a desired thickness. Then the film or sheet is cut or punched into a desired shape. The resulting film or sheet is then provided on one of or placed between two articles, one of which is transparent or translucent to actinic light, and then exposed to an actinic light. If the gel contains an epoxy compound and an epoxy hardener, the articles are further subjected to heat treatment.

If the photocurable self-retainable gel is employed in the preparation of photoresists for printed circuit boards or printing plates for letterpress printing, the gel is melted at a temperature above the flow temperature of the gel to give a sol. The resulting sol is then formed into a film or sheet having the desired thickness by cooling the sol to a temperature below the flow temperature of the gel. Then, an image-bearing transparency is placed in contact with the surface of the resulting non-tacky film which is then exposed to actinic light through the transparency. Unexposed portions of the film can be removed using various methods. For instance, these portions can simply be melted at a temperature above the flow temperature of the film and then brushed off or absorbed by a sheet of paper or a nonwoven fabric. The melted unexposed portions may also be dipped in hot water and dissolved away or they may be sprayed off with hot water which may contain a surfactant. Further, the unexposed portions of the film may be removed by using a hot air gun.

When the photocurable gel contains an epoxy compound and an epoxy hardener, the imaged article resulting from photoimaging may be further subjected to heat treatment.

If the photocurable self-retainable gel of the present invention is employed in the protection or encapsulation of electronic parts or components, the gel is melted at a temperature above the flow temperature of the gel to give a sol. The resulting sol is then poured onto the parts which have been placed in a mold and then cooled to a temperature below the flow temperature of the gel to convert the sol back to a gel. The parts covered with the gel are then removed from the mold or shell and exposed to actinic light.

In lieu of pouring the sol onto electronic parts, a specifically designed sheet could be used. For instance, a sheet of the photocurable self-retainable gel can be designed to have a shape which corresponds to the shape of the parts. This designed sheet is then placed on the parts and melted at a temperature above the flow temperature of the gel, followed by cooling and exposure to actinic light as described above. Further, the exposure to the actinic light may be carried out before cooling the sol to a temperature below the flow temperature of the gel.

The protection or encapsulation of an article with the photocurable self-retainable gel of the present invention will now be illustrated by reference to the drawings.

Figure 1A:
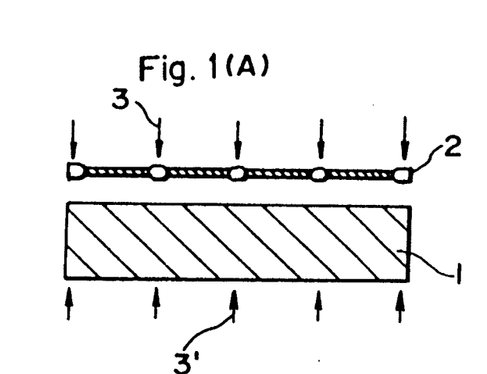
FIGS. 1A–1D is a schematic flow sheet showing one embodiment of the methods of fixing articles, such as electronic parts or components, to a substrate with the photocurable, self-retainable gel according to the present invention.
Figure 1B:
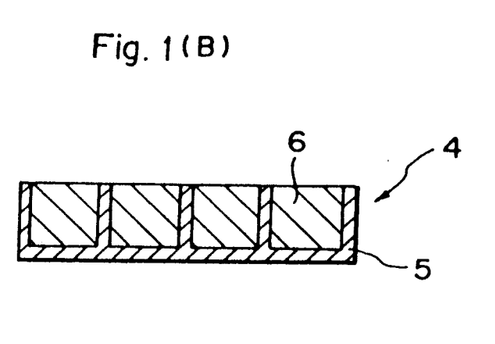
Figure 1C:
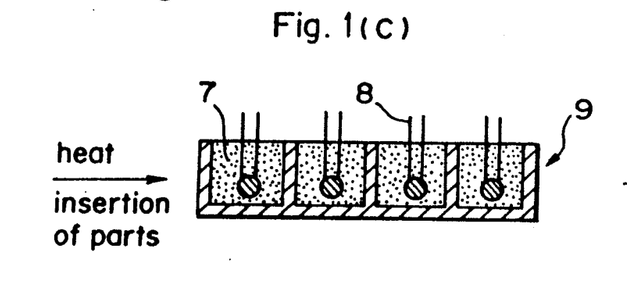
Figure 1D:
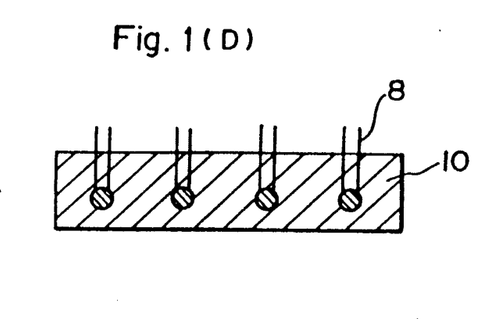

FIGS. 1A-1D illustrates the encapsulation of electronic parts or components. In FIG. 1A a surface of a photocurable self-retainable gel in the form of a sheet 1 is exposed to actinic light 3 through a negative grid 2. The entire surface of the other side of sheet 1 is then exposed to actinic light 3'. Simultaneous exposure of both sides to the actinic light can also be conducted. As a result, as shown in FIG. 1B, a sheet 4 of the partially cured gel is created. Portions 5 in FIG. 1(B) represent the portions of sheet 1 in (A) which have been cured. Portions 6 are uncured portions of the gel. Then, the partially cured sheet 4 is heated, for example, on a hot plate to melt uncured portions 6. As illustrated in FIG. 1(C), each of the electronic parts 8 to be fixed or encapsulated is entirely or partially inserted in the respective melted portions 7. Subsequently, the surfaces of the melted portions 7 are exposed to actinic light. In the alternative, after the insertion of the electronic parts in the melted portions 7, the sheet 9 of FIG. 1(C) is cooled to solidify the melted portions 7 and then the entire surface of the uncured portions of the sheet thus obtained is exposed to the actinic light. As a result, the electronic parts 8 encapsulated with the cured gel 10 is obtained. See FIG. 1D.

In this embodiment sheet 1 may be provided on a transparent or translucent substrate. Furthermore, if sheet 1 in FIG. 1(A) contains an epoxy compound and an epoxy hardener, the electronic parts 8 which are fixed or encapsulated with the cured gel 10 are further subjected to heat treatment.

Figure 2:
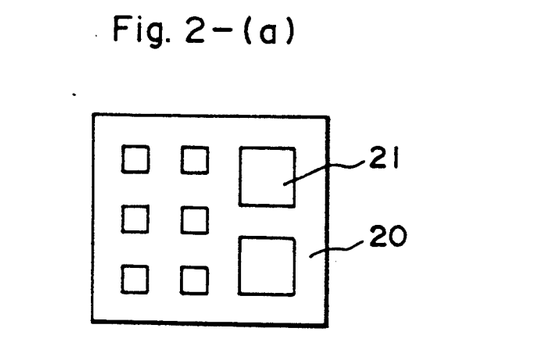

In another embodiment of the invention relating to methods of using the photocurable self-retainable gel, an integrated circuit (IC) chip which is mounted onto a printed circuit board can be encapsulated or protected as shown in FIGS. 2-(a) to 2-(g). In FIGS. 2-(a) and 2-(b), silicon chips 21 are mounted on a substrate 20. Separately, a mask 22 as shown in FIG. 2-(c) in which portions 23 do not allow the transmission of actinic light is prepared. Each of the portions 23 has a larger surface area than the surface area of the corresponding silicon chip. Mask 22 is then placed on a sheet of the photocurable self-retainable gel of the present invention and the sheet is exposed to an actinic light through the mask 22. As illustrated in FIGS. 2-(d) and 2-(e)-1, that exposure gives a sheet 24 of partially cured photocurable self-retainable gel in which portions 25 have been cured but portions 26 remain uncured. The entire surface of the other side of the partially cured sheet is then exposed to actinic light the time of, before or after the exposure through the mask. The cross section of the partially cured sheet 24 thus obtained is schematically shown in FIG. 2-(e)-2. Further, when the sheet is provided with supporting material a partially cured sheet having support material 27 and which has a cross section schematically shown in FIG. 2-(e)-3 results. The partially cured sheet 24 is then attached or affixed to the IC chip mounted printed circuit board so as to match each uncured portion 26 with each corresponding IC chip 21 of the sheet is then heated at a temperature above the flow temperature of the sheet, to melt the uncured portions 28 of FIG. 2-(f) which correspond to the uncured portions 26 of FIG. 2-(d). Subsequently, the entire surface of the melted uncured portions is exposed to an actinic light 29. See FIG. 2-(g). This exposure to actinic light may be conducted after the sheet having the melted uncured portions 28 has been cooled to a temperature below the flow temperature of the photocurable self-retainable gel which the sheet comprises. As a result, there is obtained an IC chip-mounted printed circuit board whose IC chips have been encapsulated with the cured gel of the present invention. Further, if the photocurable self-retainable gel contains epoxy compound and epoxy hardener the printed circuit board thus obtained may be further subjected to heat treatment.

The examples which follow are given for illustrative purposes and are no way meant to limit the scope of the invention described and claimed herein.

In the following examples, unless otherwise expressly stated, a polymer having a weight average molecular weight of about 320,000 determined by gas permeation chromatography (GPC) and prepared by the anionic polymerization of methyl methacrylate with phenyl magnesium bromide as the initiator, was used to illustrate isotactic polymethyl methacrylate. A polymer having a weight average molecular weight of about 100,000 determined by GPC and prepared by the radical polymerization of methyl methacrylate with azobisisobutyronitrile as the catalyst was used to illustrate a syndiotactic polymethyl methacrylate.

EXAMPLE 1

Isotactic polymethyl methacrylate (2.0 g), and syndiotactic polymethyl methacrylate (10.0 g) were dissolved in methyl methacrylate (48.0 g) in the presence of hydroquinone (0.06 g) under heating and then added with 2,2-dimethoxy-2-phenyl acetophenone (0.9 g) to prepare a photocurable sol. This sol had a gel flow temperature of about 80° C. and gave a gel when it was cooled to room temperature.

After the photocurable gel was heated to 100° C. to form a uniform and clear sol, the sol was cast onto a 50 μm-thick polyester film by using a 1 mm-thick doctor blade. When the sol which formed on the polyester film was kept at room temperature for 2 minutes, the cast photocurable sol became a transparent self-retainable photocurable gelled sheet.

Using a Jet Printer JP-2000 (manufactured by Oak Co.) the entire surface of the gelled sheet thus obtained was exposed to an actinic light at 20 mJ/cm from the side of the polyester film which provided a substrate. A negative mask was then tightly placed on the surface of the gelled sheet, which was in turn exposed to actinic light at 200 mJ/cm$^2$ through the negative mask.

Then the negative mask was removed and the polyester film side was contacted with a hot plate at about 120° C., while a sheet of folded absorbent paper ("Kimwipe Wipers-200", a product of Jujo-Kimberley K.K.) was lightly pressed on the surface of the exposed sheet for about 2 minutes to remove the melted uncured gel. Then a roller was softly rolled over the sheet of the paper several times and the sheet of absorbent paper was pealed off. As a result, melted unexposed portions of the sheet were completely absorbed in the paper and a clear relief of the positive image was obtained.

Separately, another photocurable gelled sheet was prepared in the manner as described above and then exposed to an actinic light at 850 mJ/cm$^2$ from both sides of the gelled sheet to cure the gelled sheet. The cured sheet was dipped in boiling water for 20 hours to examine water resistance. The weight of the cured sheet only increased by 3.6% by weight.

EXAMPLE 2

Isotactic polymethyl methacrylate (2.5 g), syndiotactic polymethyl methacrylate (12.5 g), hydroxyethyl methacrylate (59.5 g), and trimethylolpropane trimethacrylate (25.5 g) were added with hydroquinone (0.1 g). The resulting mixture was heated to 120° C. to form a uniform sol. This sol was cooled to 100° C., after which 2,2-dimethoxy-2-phenyl acetophenone (1.5 g) was added to prepare a photocurable sol. The photocurable sol thus prepared was cast on a polyester film in the same manner as in Example 1. After standing at room temperature for 2 minutes, the sol had converted to photocurable self-retainable gelled sheet. The sheet had a flow temperature of about 70° C.

A clear relief of the positive image was obtained from this photocurable gelled sheet in the same manner as in Example 1.

Subsequently, another photocurable gelled sheet was prepared in the same manner as described above and exposed to an actinic light at 850 mJ/cm$^2$ from both sides of the gelled sheet to cure the gelled sheet and the cured sheet was dipped in boiling water for 20 hours to examine water resistance. As a result, the weight of the cured sheet was increased by 0.56% by weight.

EXAMPLE 3

The photocurable composition obtained in Example 2 was cast onto a 1 mm-thick transparent polymethyl methacrylate sheet in the same manner as in Example 1 to obtain a photocurable gelled sheet.

A negative mask was placed on the sheet thus obtained, and the sheet was exposed to actinic light at 200 mJ/cm$^2$. After the exposure, the surface of the sheet was mildly rubbed in a warm water bath kept at 75° C. with a nylon brush. As a result, unexposed portions of the cured sheet were easily removed to give a clear relief on the positive image.

EXAMPLE 4

The procedure of Example 2 was repeated except that 3 g out of the 59.5 g of the hydroxyethyl methacrylate were replaced with acrylic acid. As a result, a self-retainable photocurable gel was obtained. This gel was converted into a sol by heating at 80° C., from which a film of about 30 μm in thickness was cast onto a well polished copper-glass epoxy laminated board with a doctor blade.

After the board was left to stand at room temperature the film of the photocurable sol thereon converted to photocurable gel. A negative mask was then tightly placed on the gel and the gel was exposed to actinic light at 100 mJ/cm$^2$ through the mask. The exposed gel was developed in 75° C. water in the same manner as in Example 1 to give a clear relief of the positive image.

EXAMPLE 5

The procedure of Example 2 was repeated except that 3 g of the 59.5 g hydroxyethyl methacrylate were replaced with acrylic acid. As a result, a photocurable gel was obtained. The resulting gel then converted into a sol after heating at 80° C. Subsequently, a 1.5 mm-thick copper clad glass-epoxy laminate having 3 mm through-holes was heated to 80° C. and dipped in this sol and then removed. Excess sol was removed by a hot air knife heated to about 90° C. The laminate was then cooled to room temperature to obtain a laminate coated with the photocurable gel having a thickness of about 15 μm. The laminate thus prepared was exposed to actinic light at 200 mJ/cm$^2$ through a mask from both sides of the laminate, including the through-hole portions. Then the surfaces of the laminate were mildly rubbed in chloroform with a nylon brush to develop an image. As a result, cured gel remained only in the exposed portions including the inner walls of the through-holes and a clear image was obtained.

EXAMPLE 6

Divinylbenzene polymer particles (available as Micropearl particles, a product of Sekisui Kagaku K.K.) having particle sizes in the range of 10–15 μm were dispersed in the photocurable sol illustrated in Example 4. The particles were added as spacer particles and were added in amount equalling 5% by weight of the sol. The resulting sol was cast onto a silicon-based releasing paper with a doctor blade and cooled to room temperature to obtain an about 20 μm-thick gelled film. The film-coated silicone releasing paper was cut into a 5 cm×5 cm square after which the entire surface of the gelled film was covered with a filter paper. A steel plate measuring 4 cm (width)×4 cm (length)×1 cm (thickness) was heated to 120° C. and pressed on the filter paper to melt and remove a 4 cm×4 cm square shaped center portion of the gelled film, thus forming an internal area which was surrounded by a square. That square comprised the remaining photocurable gel. The remaining square was then cut with a pair of scissors to create a path to the internal area of the square. The coated silicone paper was then transferred onto a 6 cm×6 cm square glass plate having a thickness of 1 mm. Another glass plate of the same size was superimposed on the surface of the photocurable gelled square, and the steel plate as used above was heated to 120° C. and placed on the glass plate to confirm that the gelled film between the plates had melted. The glass plates were then cooled to room temperature. Subsequently, the glass plates were exposed to a mercury lamp at 400 mJ/cm$^2$ to cure the gelled film. The above procedures resulted in a glass laminate sealed by a 1.2 cm and 10 μm thick bead, wherein the bead formed a square. The square internal area within the bead was interconnected to outside the bead through the path or cutoff portion. The internal area within the bead measured 4 cm×4 cm.

Instead of covering the entire surface of the gelled film with a sheet of filter paper, the gelled film was covered with aluminum foil having a 4 cm×4 cm opening at the center and then was cured by exposing only the area corresponding to the opening to a mercury lamp at 200 mJ/cm$^2$. After the aluminum foil was removed, uncured areas were heated on a glass plate by a 120° C. hot plate and then processed in the same manner as described above to obtain glass laminate.

EXAMPLE 7

Isotactic polymethyl methacrylate (5.0 g), syndiotactic polymethyl methacrylate (15.0 g), hydroquinone (0.2 g) and 2,2-dimethoxy-2-phenyl acetophenone (3.0 g) were dissolved in a mixture of trimethylolpropane triacrylate (20 g), methacrylic acid (6 g) and a urethane acrylate monomer having the structure $CH_2=CHCOOCH_2CH_2OCONHC_4H_9$ (154 g) under heating. The mixture was then cooled to room temperature to quickly form a photocurable gel. The gel flow temperature was about 65° C.

The sol obtained by melting the gel thus obtained was used to prepare a gelled film (A) having a thickness of about 40 μm and a sheet (B) having a thickness of about 1.5 mm on a 50 μm-thick polyester film.

The following were also prepared: (C) an IC testing chip (size=7 mm×7 mm; thickness=0.3 mm) having circuits for conductivity tests and a total of 120 pads with gold bumps (size=0.01 mm×0.01 mm; height=30 microns), 30 pads on each side located at equal intervals of 0.2 mm; (D) a glass plate (size=50 mm×50 mm; thickness=1.1 mm) having 120 terminals of a transparent indium-tin oxide layer at the center of the glass plate formed to match the pads on the IC testing chip; and (E) a silicone rubber frame (size=50 mm×50 mm; thickness=2.0 mm) punched with a 15 mm×15 mm square at the center.

The gelled film (A) was cut and reduced to 10 mm×10 mm square and was placed on the area of the glass plate (D) having the 120 terminals. The IC testing chip was then aligned on the gelled film so that the bumps on the chip would match the indium tin oxide terminals on the glass plate. Then pressure amounting to 20 kg/cm$^2$ was applied by a metal bonder heated at 100° C. to press the chip for 30 seconds. Then, while still under pressure, the chip was exposed to a mercury lamp at 400 mJ/cm² through the glass plate to cure the gelled film. After the chip was cooled to room temperature and a dike was provided around the IC chip with the silicone rubber frame (E), the gelled sheet (B), which had been cut and reduced to a 14 mm×14 mm square, was placed on the IC chip. The element thus obtained, together with the glass plate, was placed on a hot plate heated at 100° C. After about 3 minutes, the gelled sheet had completely melted, after when the element was then cooled to room temperature. After the melted portion was converted back to a gel, the silicone rubber frame (E) was removed, and the gelled portion was exposed to a mercury lamp for 400 mJ/cm² to completely cure the gelled portion.

Thus, the IC chip was packaged, and the outer terminals on the sealed glass plate was subjected to a conductivity test by using a tester. It was confirmed that the IC chip with the entire pad was connected electrically to the terminal on the glass substrate.

EXAMPLE 8

A tape carrier mounted with an IC chip (F) was prepared by a conventional method. Specifically, an IC testing chip (C) similar to that used in Example 7 was bonded to a polyimide tape carrier (thickness of=75 microns; external size=35 mm×35 mm; device hole size=12 mm×12 mm; total inner leads=120; inner lead pitch=0.2 mm). Separately, an aluminum case (G) having dimensions of 40 mm×40 mm×40 mm was prepared.

A gel sheet having a size of 35 mm×35 mm (B) of Example 7 was placed on the bottom of the aluminum case (G), after which the tape carrier mounted with the IC chip (F) was placed on sheet (B). Then, another gel sheet (size=35 mm×35 mm) (B) of Example 7 was placed on the tape carrier (F) in case (G). The case was then heated at 100° C. in an oven for 10 minutes, after which case (G) was removed from the oven and cooled to room temperature. The tape carrier (F) encapsulated with the uncured photocurable gel was then removed from the aluminum case (G).

Except for a 15 mm×15 mm area of the tape carrier surrounding the IC chip, both sides of the encapsulated tape carrier were then masked with a light-shielding tape. The encapsulated tape carrier was subsequently exposed on both sides to actinic light at 400 mJ/cm². After removing the light-shielding tape, the encapsulated carrier was placed on a hot plate heated to 100° C. and the melted photocurable gel in unexposed areas was removed with a sheet of absorbent paper. As a result, an IC chip mounted on to a tape carrier encapsulated with resin was obtained.

EXAMPLE 9

Isotactic polymethyl methacrylate (1.86 g) and syndiotactic polymethyl methacrylate (5.57 g) were dissolved in an epoxy resin (24.67 g) (Epikote-828 epoxy available from Shell Chemical) at 120° C. The sol thus obtained was then cooled to 100° C., at which time a dispersion (5.06 g) of dicyandiamide (1.69 g) in Epikote-828 epoxy (3.37 g) was added and stirred. The sol thus obtained was poured onto a sheet of silicone releasing paper to a thickness of 0.5 mm and left to stand at −5° C. for 30 minutes in a refrigerator to give a gelled sheet.

The self-retainable, gelled sheet was then sandwiched between two glass plates to give a laminate. The laminate was heated at 170° C. for one hour in an oven and subsequently cooled to room temperature. The glass plates could not be separated from each other without breaking the plates.

EXAMPLE 10

Isotactic polymethyl methacrylate (1.86 g) and syndiotactic polymethyl methacrylate (5.57 g) were dissolved in trimethylolpropane triglycidylether (24.67 g) (Epolite 100MF available from Kyoeisha Oil and Fats K.K.) at 120° C. to give a sol. The resulting sol was cooled to 100° C., after which a dispersion (5.06 g) of dicyandiamide (1.69 g) in Epikote-828 epoxy (3.37 g) was added and stirred to give a uniform sol.

The sol thus obtained was cast onto a sheet of silicone releasing paper to a thickness of 0.5 mm and left to stand at −5° C. for 30 minutes in a refrigerator to give a heat-curable gelled sheet.

The self-retainable, gelled sheet was then sandwiched between two glass plates to give a laminate. The laminate was heated at 170° C. for one hour in an oven, and subsequently cooled to room temperature. The glass plates could not be separated from each other without breaking the plates.

EXAMPLE 11

Isotactic polymethyl methacrylate (0.83 g), syndiotactic polymethyl methacrylate (2.50 g) and hydroquinone (0.03 g) were dissolved in a mixture of Epikote-828 epoxy (15 g) and trimethylolpropane triacrylate (15 g) at 120° C. and then cooled to 100° C. A dispersion (0.33 g) of dicyandiamide (0.11 g) in Epikote-828 epoxy (0.22 g) was then added and stirred. Subsequently, 2,2-dimethoxy-2-phenyl acetophenone (0.33 g) and 3-(p-chlorophenyl)-1,1-dimethyl urea (1.00 g) were added and stirred to give a uniform sol. The sol thus obtained was cast onto a sheet of silicone releasing paper to a thickness of 0.5 mm and cooled at −5° C. for one hour to give a heat-and photo-curable self-retainable gel sheet.

The gelled sheet thus obtained was exposed to a mercury lamp at 1000 mJ/cm² to give a cured sheet. Then the cured sheet was sandwiched between two glass plates to give a laminate, which was then heated at 170° C. for one hour under a load of 1 kg. Resin flow was not observed and the two glass plates were strongly adhered together and could not be separated without breaking the glass.

Isotactic polymethyl methacrylate (1.0 g), syndiotactic polymethyl methacrylate (3.0 g) and hydroquinone (0.03 g) were dissolved in a mixture of dimethyl phthalate (6.81 g), trimethylolpropane triacrylate (1.59 g) and HOA-MPL 2-acryloxyethyl phthalate (14.30 g), a product from Kyoeisha Oil and Fats K.K.) and heated to 120° C. After a clear sol was obtained 2,2-dimethyloxy-2-phenyl acetophenone (0.33 g) was added to the sol. The sol thus obtained was cast onto a 50 μm-thick polyester sheet and cooled at −5° C. for one hour to give a photocurable self-retainable gelled sheet having a thickness of 5 mm.

The resulting gelled sheet was then cut and reduced to a 25 mm×55 mm section and exposed to a mercury lamp from the side of the polyester film at 100 mJ/cm² to partially cure the gel adjacent to the polyester film. Subsequently, a negative mask was placed on the photocurable gelled sheet, and exposed to a mercury lamp for 1000 mJ/cm² to give an image which comprises partially cured gel on the polyester film. Then the polyester film side of the partially photocured sheet was contacted with a hot plate heated to 100° C. to melt the uncured portions of the sheet. Ten silicone chips each having a size of 2 mm×2 mm×0.7 mm as a model of electronic parts were then embedded in each of the melted portions. The sheet was cooled to room temperature. After the entire surface of the melted portions was exposed to a mercury lamp at 1000 mJ/cm², a cured sheet where the silicon chips had been embedded was obtained.

EXAMPLE 13

Isotactic polymethyl methacrylate (4.24 g), syndiotactic polymethyl methacrylate (12.72 g) and hydroquinone (0.15 g) were dissolved in a mixture of ethylene glycol diacrylate (45.8 g) and Epoxyester 3000A (42.0 g) epoxy ester, a product which is prepared from bisphenol-A diglycidylether and acrylic acid and which is available from Kyoeisha Oil and Fat K.K. The mixture was heated to 120° C. The sol thus obtained was cooled to 90° C., after which hexahydrophthalic anhydride (30.8 g) was added to carry out a 2-hour reaction which was intended to carboxylate the hydroxy groups of the epoxy ester.

A solution of 2,2-dimethoxy-2-phenyl acetophenone (1.8 g) and 3-(p-chlorophenyl)-1,1-dimethylurea (3.00 g) in Epikote-828 epoxy (34.0 g) was added to the sol as prepared above. The resulting mixture was then cast onto a polyester film to form a sheet having a thickness of 5 mm and then kept at $-5°$ C. for one hour to give a heat- and photo-curable self-retainable gelled sheet.

The resulting gelled sheet was cut and reduced to a 25 mm×55 mm section and exposed to a mercury lamp from the side of the polyester film at 100 mJ/cm² to make a substrate by partially curing the gelled sheet adjacent to the polyester film. Then, a negative mask was placed on the side of the photocurable gelled sheet, and exposed to a mercury lamp at 1000 mJ/cm² through the mask to give a partially cured sheet on the polyester film. Subsequently, the side of the polyester film was contacted with a hot plate heated at 100° C. to melt uncured portions of the sheet. Ten silicone chips each having a size of 2 mm×2 mm×0.7 mm as a model of electronic parts were embedded in each of the melted portions and the sheet was cooled to room temperature. After the entire surface of the melted portions was exposed to a mercury lamp at 1000 mJ/cm² to cure the melted portions, and the sheet was further heated at 150° C. for 2 hours in an oven. As a result, a cured article where ten silicon chips had been embedded was obtained.

EXAMPLE 14

Uncured photocurable sols were prepared from isotactic polymethyl methacrylate (1.0 g) as well as from the following: each of the commercially available syndiotactic methyl methacrylate polymers (3.0 g) shown in Table 1; each of the photopolymerizable ethylenically unsaturated compounds (40 g) shown in Table 1; a hydroquinone (0.04 g) polymerization inhibitor; and 2,2-dimethoxy-2-phenyl acetophenone (0.4 g) polymerization initiator. All of the resulting sols gave self-retainable gels when they were cooled to room temperature.

The sols thus obtained were formed into cylindrical gels having a size of 38 mm in diameter×10 mm in thickness. The gels were then left to stand at room temperature for 30 days in sealed bottles in order to measure the decrease in gel weight due to monomer bleeding. The weight retention ratios of the weight of the gel after 30 days to the initial weight of the gel are shown in Table 1. As indicated in Table 1, monomer bleeding can be improved by introducing functional groups onto polymethyl methacrylate.

TABLE 1

| Run No. | Syndiotactic Methyl Methacrylate Polymer (Mn) | Photopolymerizable Ethylenically Unsaturated Compound | Weight Retention Ratio |
| --- | --- | --- | --- |
| 1 | Polymer obtained by conventional radical polymerization with azobisisobutylronitrile (6,000) | $CH_2$=$CHCOOCH_2CH_2OCOCH_2CH_2COOH$ | 0.97 |
| 2 | Polymer obtained by conventional radical polymerization with azobisisobutylronitrile (6,000) | $CH_2$=$CHCOO(CH_2CH_2O)_4COCH$=$CH_2$ | 0.91 |
| 3 | Polymer obtained by conventional radical polymerization with azobisisobutylronitrile (6,000) | $CH_2$=$C(CH_3)CO(OCH_2CH_2)_4OCH_3$ | 0.93 |
| 4 | Polymer obtained by conventional radical polymerization with azobisisobutylronitrile (6,000) | $CH_2$=$C(CH_3)COO(CH_2CH_2O)_4COC(CH_3)$=$CH_2$ | |
| 5 | Polymer obtained by conventional radical polymerization with azobisisobutylronitrile (6,000) | $CH_2$=$CHCOO[CH_2CH(CH_3)O]_2CH_3$ | 0.88 |
| 6 | Polymethyl methacrylate macromonomer* (6,000) [(PMMA***)-CH(OH)CH₂COOH] | $CH_2$=$CHCOOCH_2CH_2OCOCH_2CH_2COOH$ | 1.00 |
| 7 | Polymethyl methacrylate macromonomer* (6,000) [(PMMA***)-CH(OH)CH₂COOH] | $CH_2$=$CHCOO(CH_2CH_2O)_4COCH$=$CH_2$ | 0.98 |
| 8 | Polymethyl methacrylate macromonomer* (6,000) [(PMMA***)-CH(OH)CH₂COOH] | $CH_2$=$C(CH_3)CO(OCH_2CH_2)_4OCH_3$ | 0.97 |
| 9 | Polymethyl methacrylate macromonomer* (6,000) [(PMMA***)-CH(OH)CH₂COOH] | $CH_2$=$C(CH_3)COO(CH_2CH_2O)_4COC(CH_3)$=$CH_2$ | |
| 10 | Polymethyl methacrylate macromonomer* (6,000) [(PMMA***)-CH(OH)CH₂COOH] | $CH_2$=$CHCOO[CH_2CH(CH_3)O]_2$ | 0.96 |
| 11 | Polymethyl methacrylate macromonomer** (6,000) [PMMA***)-CH(COOH)CH₂COOH] | $CH_2$=$CHCOOCH_2CH_2OCOCH_2CH_2COOH$ | 1.00 |
| 12 | Polymethyl methacrylate macromonomer** (6,000) | $CH_2$=$CHCOO(CH_2CH_2O)_4COCH$=$CH_2$ | 0.98 |

TABLE 1-continued

| Run No. | Syndiotactic Methyl Methacrylate Polymer (Mn) | Photopolymerizable Ethylenically Unsaturated Compound | Weight Retention Ratio |
|---|---|---|---|
| 13 | Polymethyl methacrylate macromonomer** (6,000) [PMMA***)-CH(COOH)CH$_2$COOH] | CH$_2$=C(CH$_3$)CO(OCH$_2$CH$_2$)$_4$OCH$_3$ | 0.97 |
| 14 | Polymethyl methacrylate macromonomer** (6,000) [PMMA***)-CH(COOH)CH$_2$COOH] | CH$_2$=C(CH$_3$)COO(CH$_2$CH$_2$O)$_4$COC(CH$_3$)=CH$_2$ | |
| 15 | Polymethyl methacrylate macromonomer** (6,000) [PMMA***)-CH(COOH)CH$_2$COOH] | CH$_2$=CHCOO[CH$_2$CH(CH$_2$CH(CH$_3$)O]$_2$CH$_3$ | 0.96 |

*Product of Toagosei Chem Ind. Co.
**Product of Toagosei Chem Ind. Co.
***PMMA: polymethyl methacrylate

EXAMPLE 15

Uncured photocurable sols were prepared from isotactic polymethyl methacrylate (1.0 g) as well as the following: each of the commercially available syndiotactic methyl methacrylate polymers (3.0 g) shown in Table 2; each of the photopolymerizable ethylenically unsaturated compounds (40 g) shown in Table 2; hydroquinone (0.04 g) photopolymerization inhibitor; and 2,2-dimethoxy-2-phenyl acetophenone (0.4 g) photopolmerization initiator. All of the resulting sols gave self-retainable gels when they were cooled to room temperature.

The sols thus obtained were formed into cylindrical gels having a size of 38 mm in diameter×10 mm in thickness. The decrease in weight of the gels due to monomer bleeding was then measured as illustrated in Example 14. The weight retention ratios of the weight of the gel after 30 days to the initial weight of the gel are shown in Table 2. As indicated in Table 2, monomer bleeding can be improved by using copolymers of methyl methacrylate instead of conventional polymethyl methacrylate.

TABLE 2

| Run No. | Syndiotactic Methyl Methacrylate Polymer (Mn) | Photopolymerizable Ethylenically Unsaturated Compound | Weight Retention Ratio |
|---|---|---|---|
| 1 | Polymer obtained by conventional radical polymerization with azobisisobutylronitrile (Mw = 100,000) | CH$_2$=CHCOOCH$_2$CH$_2$OCOCH$_2$CH$_2$COOH | 0.96 |
| 2 | Polymer obtained by conventional radical polymerization with azobisisobutylronitrile (Mw = 100,000) | CH$_2$=CHCOO(CH$_2$CH$_2$O)$_4$COCH=CH$_2$ | 0.91 |
| 3 | Polymer obtained by conventional radical polymerization with azobisisobutylronitrile (Mw = 100,000) | CH$_2$=C(CH$_3$)CO(OCH$_2$CH$_2$)$_4$OCH$_3$ | 0.92 |
| 4 | Polymer obtained by conventional radical polymerization with azobisisobutylronitrile (Mw = 100,000) | CH$_2$=C(CH$_3$)COO(CH$_2$CH$_2$O)$_4$COC(CH$_3$)=CH$_2$ | 0.92 |
| 5 | Polymer obtained by conventional radical polymerization with azobisisobutylronitrile (Mw = 100,000) | CH$_2$=CHCOO[CH$_2$CH(CH$_3$)O]$_2$CH$_3$ | 0.87 |
| 6 | Modified acryl/polymethyl methacrylate* | CH$_2$=CHCOOCH$_2$CH$_2$OCOCH$_2$CH$_2$COOH | 0.99 |
| 7 | Modified acryl/polymethyl methacrylate* | CH$_2$=CHCOO(CH$_2$CH$_2$O)$_4$COCH=CH$_2$ | 0.98 |
| 8 | Modified acryl/polymethyl methacrylate* | CH$_2$=C(CH$_3$)CO(OCH$_2$CH$_2$)$_4$OCH$_3$ | 0.99 |
| 9 | Modified acryl/polymethyl methacrylate* | CH$_2$=C(CH$_3$)COO(CH$_2$CH$_2$O)$_4$COC(CH$_3$)=CH$_2$ | 0.97 |
| 10 | Modified acryl/polymethyl methacrylate* | CH$_2$=CHCOO[CH$_2$CH(CH$_3$)O]$_2$CH$_3$ | 0.91 |
| 11 | Epoxy modified polystyrene/ polymethyl methacrylate*** | CH$_2$=CHCOOCH$_2$CH$_2$OCOCH$_2$CH$_2$COOH | 0.97 |
| 12 | Epoxy modified polystyrene/ polymethyl methacrylate*** | CH$_2$=CHCOO(CH$_2$CH$_2$O)$_4$COCH=CH$_2$ | 0.85 |
| 13 | Epoxy modified polystyrene/ polymethyl methacrylate*** | CH$_2$=C(CH$_3$)CO(OCH$_2$CH$_2$)$_4$OCH$_3$ | 1.00 |
| 14 | Epoxy modified polystyrene/ polymethyl methacrylate*** | CH$_2$=C(CH$_3$)COO(CH$_2$CH$_2$O)$_4$COC(CH$_3$)=CH$_2$ | 0.99 |
| 15 | Epoxy modified polystyrene/ polymethyl methacrylate*** | CH$_2$=CHCOO[CH$_2$CH(CH$_3$)O]$_2$CH$_3$ | 1.00 |

*"RESEDA GP-100", a product of Toagosei Chem. Ind. Co
*** "RESEDA GP-300", a product of Toagosei Chem. Ind. Co.

EXAMPLE 16

Uncured photocurable sols were prepared from isotactic polymethyl methacrylate (1.0 g), the syndiotactic methyl methacrylate polymer (3.0 g) shown in Run No. 1 of Table 2, as well as the following: each of the photopolymerizable ethylenically unsaturated compounds (40 g) shown in Table 3; each of the gelation agents shown in Table 3; hydroquinone (0.04 g) photopolymerization inhibitor; and 2,2-dimethoxy-2-phenyl acetophenone (0.4 g) photopolymerization initiator. All of the resulting sols gave self-retainable gels when they were cooled to room temperature.

The sols thus obtained were formed into cylindrical gels having a size of 38 mm in diameter×10 mm in thickness. The decrease in weight of the gels due to monomer bleeding was then measured as illustrated in Example 14. The weight retention ratio of the weight of the gels after 30 days to the initial weight of the gels are shown in Table 3. As indicated in Table 3, monomer bleeding can be improved by the addition of oil gelation agents.

TABLE 3

| | | Oil Gelation Agent | | | |
|---|---|---|---|---|---|
| | | 12-Hydroxystearic Acid | | N-Lauroyl-L-glutamic Acid Di-n-butylamide | |
| Run No. | Photopolymerizable Ethylenically Unsaturated Compound | Percent by Weight | Weight Retention Ratio | Percent by Weight | Weight Retention Ratio |
| 1 | $HO-CH[CH_2OCOC(CH_3)=CH_2]_2$ | 1 | 0.98 | 1 | 1.00 |
| 2 | $HO-CH[CH_2OCOC(CH_3)=CH_2]_2$ | 3 | 1.00 | 3 | 1.00 |
| 3 | $HO-CH[CH_2OCOC(CH_3)=CH_2]_2$ | 5 | 1.00 | 5 | 1.00 |
| 4 | $CH_2=C(CH_3)COOCH_2CH(OH)CH_3$ | — | — | 1 | 0.94 |
| 5 | $CH_2=C(CH_3)COOCH_2CH(OH)CH_3$ | 3 | 0.97 | 3 | 0.97 |
| 6 | $CH_2=C(CH_3)COOCH_2CH(OH)CH_3$ | 5 | 1.00 | 5 | 1.00 |
| 7 | $CH_2=CHCOOCH_2CH(OH)CH_3$ | 1 | 0.95 | — | — |
| 8 | $CH_2=CHCOOCH_2CH(OH)CH_3$ | 3 | 0.96 | 3 | 0.98 |
| 9 | $CH_2=CHCOOCH_2CH(OH)CH_3$ | 5 | 0.98 | 5 | 0.98 |

What is claimed:

1. A Photocurable, self-retainable gel comprising:
   (a) a polymer composition having isotactic polymethyl methacrylate moiety and syndiotactic polymethyl methacrylate moiety,
   (b) a photopolymerizable ethylenically unsaturated compound;
   (c) a photopolymerization initiator;
   (d) an epoxy compound having at least two epoxy groups and
   (e) an epoxy hardener.

2. A gel according to claim 1, wherein the total amount of said polymer composition (a) is about 3 to 70% by weight based on the total weight of said gel.

3. A gel according to claim 1, wherein the total amount of said polymer composition (a) is about 5 to 50% by weight based on the total weight of said gel.

4. A gel according to claim 1, wherein the amount of said photopolymerizable ethylenically unsaturated compound (b) is about 10 to 97% by weight based on the total weight of said gel.

5. A gel according to claim 1, wherein the amount of said photopolymerization initiator (c) is about 0.01 to 10% by weight based on the total weight of said gel.

6. A gel according to claim 1, wherein the total amount of said epoxy compound (d) and said epoxy hardener (e) is about 5 to 85% by weight based on the total weight of said gel.

7. A gel according to claim 1 further comprising (f) an oil gelation agent.

8. A gel according to claim 7 wherein the amount of said oil gelation agent is 0.1 to 20% by weight based on the total weight of said gel.

9. A gel according to claim 7 further comprising a polymerization inhibitor (g).

10. A gel according to claim 9 wherein the amount of said polymerization inhibitor is 0.001 to 5% by weight based on the total weight of said gel.

11. A gel according to claim 1 further comprising (f) an oil gelation agent.

12. A gel according to claim 11, wherein the amount of said oil gelation agent is 0.1 to 20% by weight based on the total weight of said gel.

13. A gel according to claim 11 further comprising a polymerization inhibitor (g).

14. A gel according to claim 13, wherein the amount of said polymerization inhibitor is 0.001 to 5% by weight based on the total weight of said gel.

15. A gel according to claim 1, wherein in addition said polymer composition (a) comprises a copolymer of methyl methacrylate and a monomeric compound copolymerizable with methyl methacrylate.

16. A gel according to claim 1 wherein said copolymer has a block polymethyl methacrylate sequence.

* * * * *